United States Patent
Chen et al.

(10) Patent No.: US 8,390,078 B2
(45) Date of Patent: Mar. 5, 2013

(54) QUADRANGLE MOS TRANSISTORS

(75) Inventors: Shuo-Mao Chen, Hsin-Chuang (TW); Chin-Chou Liu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 294 days.

(21) Appl. No.: 12/813,379

(22) Filed: Jun. 10, 2010

(65) Prior Publication Data
US 2011/0303984 A1 Dec. 15, 2011

(51) Int. Cl.
*H01L 27/085* (2006.01)

(52) U.S. Cl. .................. 257/401; 257/E27.06

(58) Field of Classification Search ............... 257/208, 257/365, 369, 401, E27.06
See application file for complete search history.

(56) References Cited

U.S. PATENT DOCUMENTS

| 5,517,046 A * | 5/1996 | Hsing et al. .................. 257/336 |
| 2007/0295996 A1* | 12/2007 | Mallikararjunaswamy .. 257/204 |

* cited by examiner

*Primary Examiner* — Wensing Kuo
(74) *Attorney, Agent, or Firm* — Slater & Matsil, L.L.P.

(57) ABSTRACT

A quadrangle transistor unit includes four transistor units. Each of the four transistor units includes a gate electrode. The gate electrodes of the four transistor units are aligned to four sides of a square. At least two of the four transistor units are connected in parallel.

15 Claims, 12 Drawing Sheets

US 8,390,078 B2

QUADRANGLE MOS TRANSISTORS

TECHNICAL FIELD

This disclosure relates generally to transistors, and more particularly to the design of quadrangle metal-oxide-semiconductor (MOS) transistors having symmetric layouts.

BACKGROUND

Parallel implementations are often used in high-current applications and high-frequency applications. To achieve high drive currents, metal-oxide-semiconductor (MOS) transistors are connected in parallel to form a single transistor, with the gates interconnected with each other, sources interconnected with each other, and drains interconnected with each other.

FIGS. 1 through 3 illustrate several commonly used parallel implementations, wherein gate electrodes of MOS transistors are parallel to each other. In each of FIGS. 1 through 3, letters "G" represent gates, letters "S" represent sources, and letters "D" represent drains. FIG. 1 illustrates an implementation with the active regions (including respective sources S and drains D) of the individual MOS transistors physically separated from each other. FIG. 2 illustrates an implementation wherein each of sources S and drains D may be shared by two neighboring MOS transistors, and the MOS transistors are aligned to a single direction. FIG. 3 illustrates an implementation wherein each of sources S and drains D may be shared by two neighboring MOS transistors, and the MOS transistors are arranged into an array. It was observed that these implementations suffer from various drawbacks. For example, the implementation shown in FIG. 1 suffers from poly (gate electrode) loading effect, and the critical dimensions of the poly gates are difficult to control. The poly gate electrodes may be wider at the middle and narrower at ends. Further, the IR drop in implementations shown in FIGS. 1 and 2 may be high due to long metal lines required to interconnect gates, sources, and drains. The implementations shown in FIGS. 2 and 3 may further suffer from length of diffusion (LOD) problems.

In addition to the above-described drawbacks, due to the asymmetric layouts, it is difficult to construct models for the implementations shown in FIGS. 1 through 3. The reason is that the behavior of these MOS transistors not only changes with the number of individual MOS devices connected in parallel, but also changes with the gate widths.

SUMMARY

In accordance with one aspect, a quadrangle transistor unit includes four transistor units. Each of the four transistor units includes a gate electrode. The gate electrodes of the four transistor units are aligned to four sides of a square. At least two of the four transistor units are connected in parallel.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Novel parallel implementations of metal-oxide-semiconductor (MOS) transistors are provided in accordance with various embodiments. The variations of the embodiments are then discussed. Throughout the various views and illustrative embodiments, like reference numbers are used to designate like elements. Throughout the description, when two transistors are referred to as being electrically coupled/connected in parallel, the gates of the transistors are electrically coupled/connected to each other, the sources of the transistors are electrically coupled/connected to each other, and the drains of the transistors are coupled to each other.

Figure 1:
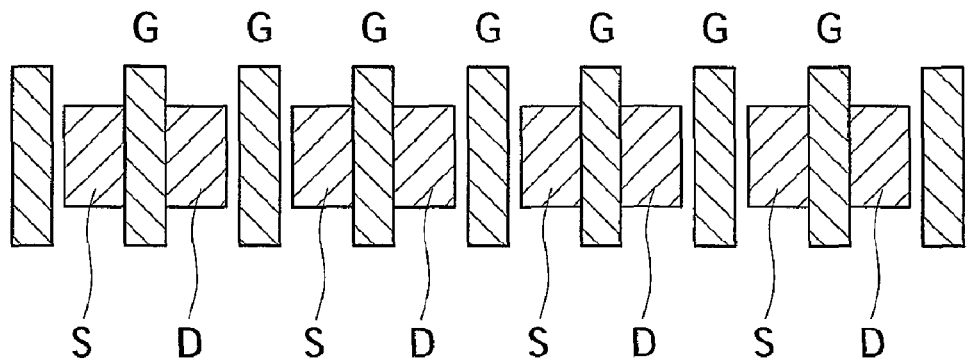
FIGS. 1 through 3 illustrate conventional parallel implementations of metal-oxide-semiconductor (MOS) transistors.
Figure 2:
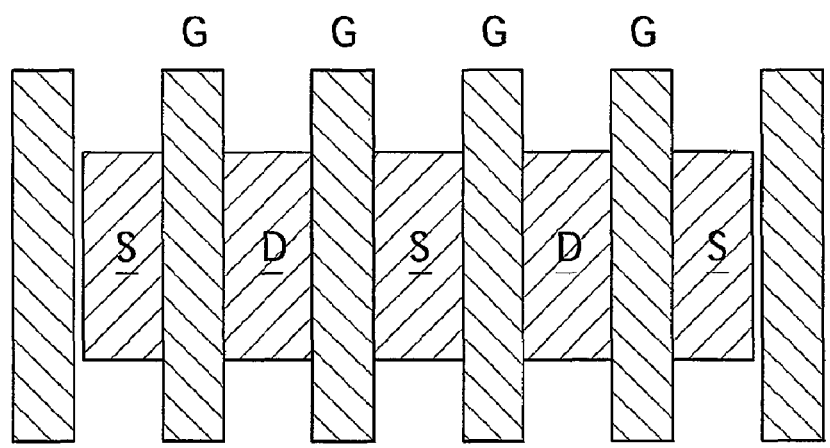
Figure 3:
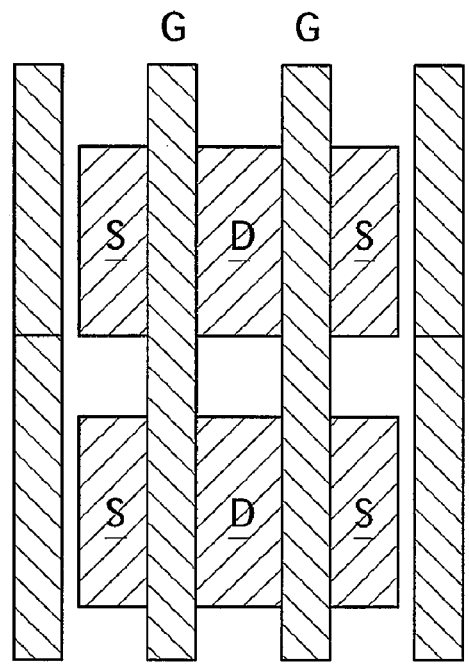
Figure 4A:
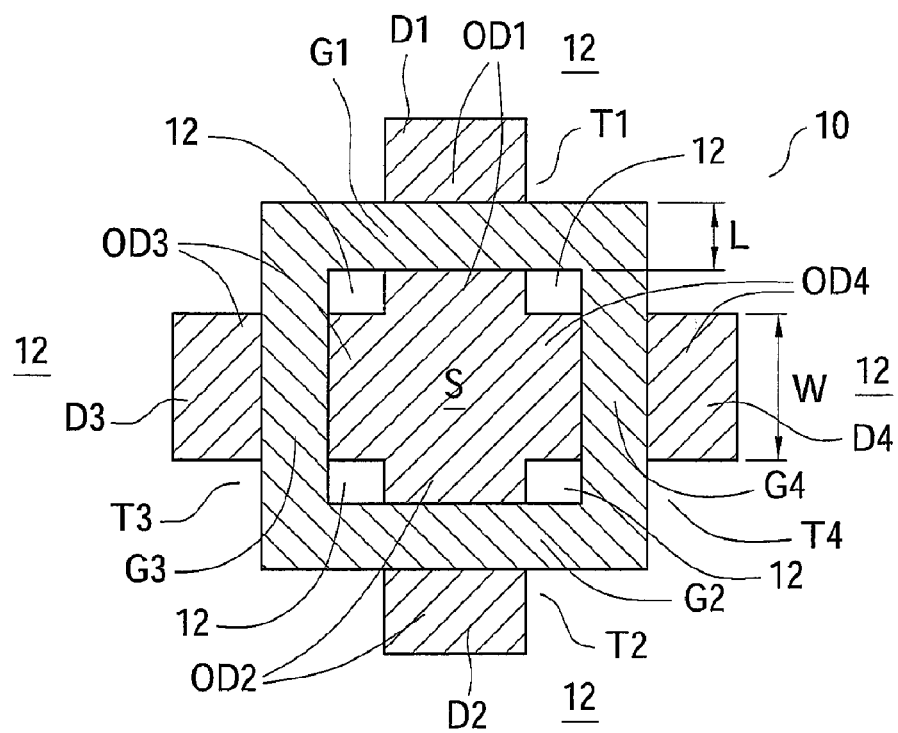
FIGS. 4A through 4D illustrate the layouts of quadrangle transistor units in accordance with various embodiments.
Figure 4B:
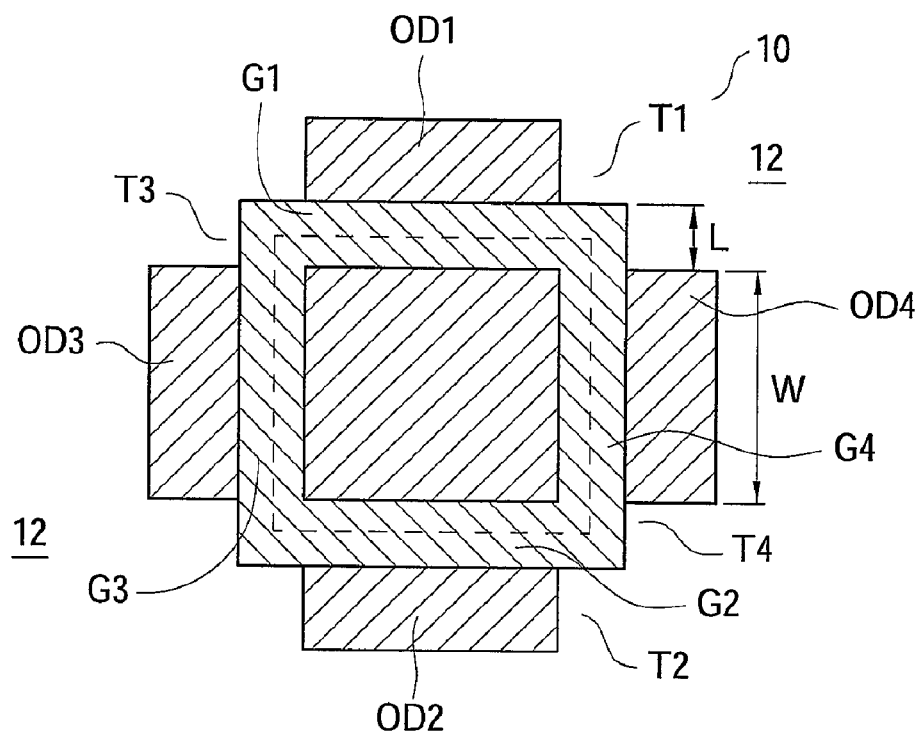
Figure 4C:
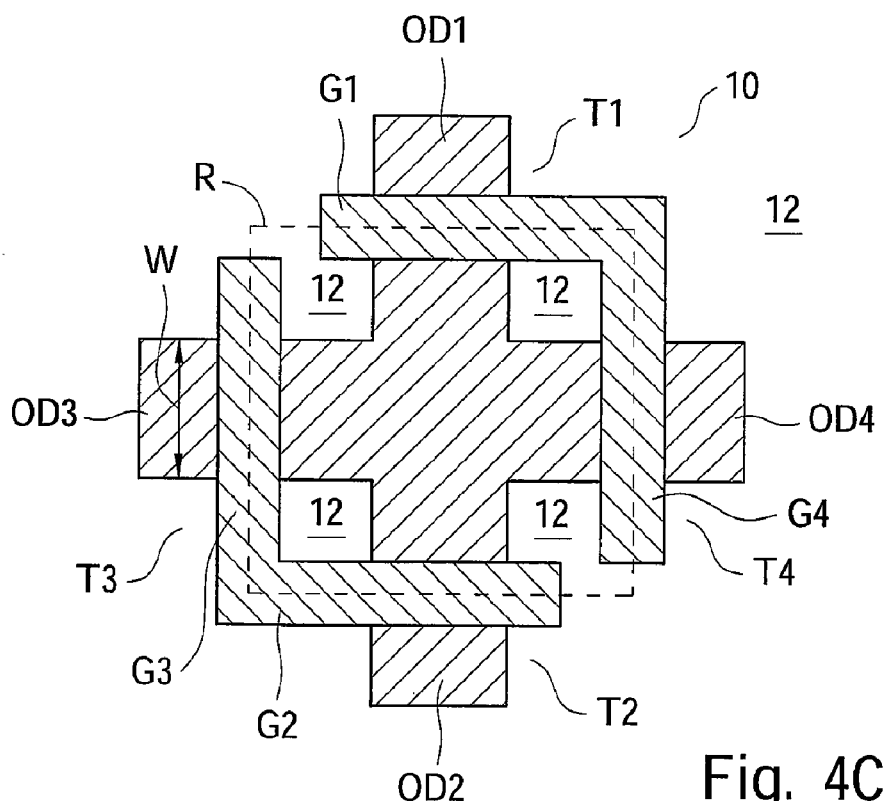
Figure 6:
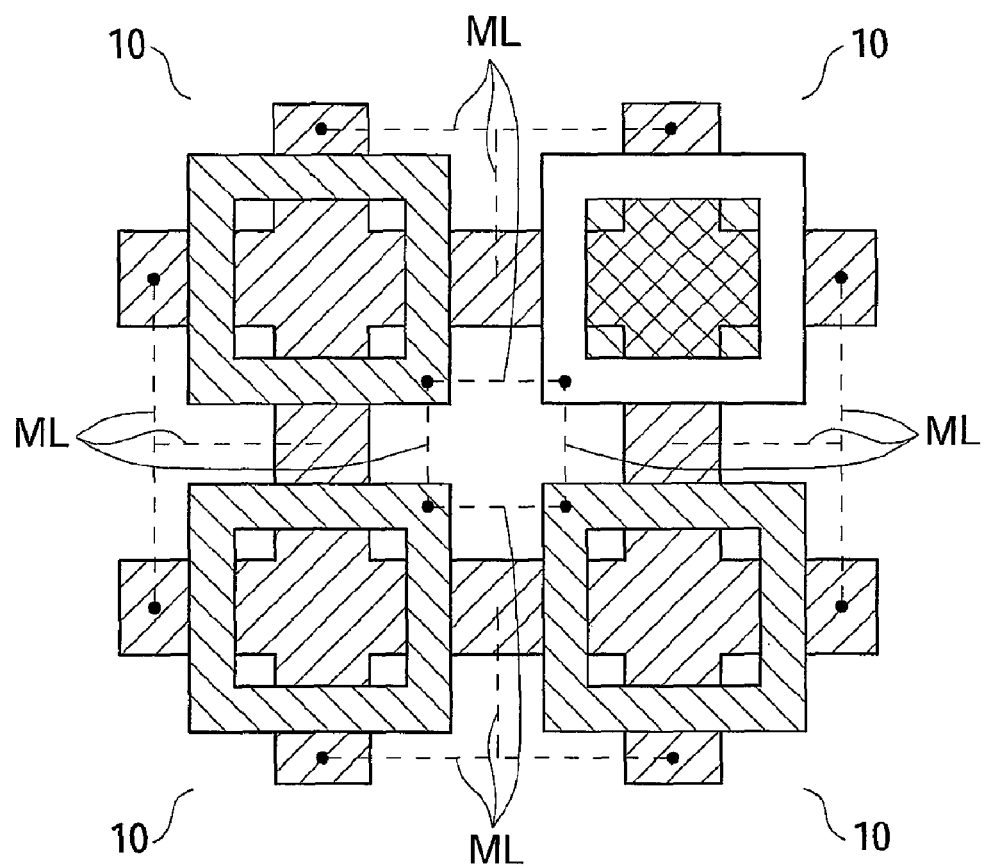
FIG. 6 illustrates a quadrangle transistor array.

FIG. 4A through 4D illustrate layouts of quadrangle transistor units 10 in accordance with various embodiments. Throughout the description, the term "quadrangle transistor unit" refers to the combination of four transistor units (for example, transistors T1 through T4), each including a gate electrode (for example, G1 through G4) over an active region (marked as OD1 through OD4). No additional transistors are formed in the region defined by the four transistor units. Gate electrodes G1 and G2 of transistor units T1 and T2 are parallel to each other, and perpendicular to gate electrodes G3 and G4 of transistor units T3 and T4. Gate electrodes G1 through G4 of transistor units T1 through T4 may be all interconnected physically to form a closed loop, as shown in FIG. 4A. Alternatively, as shown in FIG. 4C, gate electrodes G1 and G4 may be interconnected, and disconnected from gate electrodes G2 and G3, which are also interconnected with each other. However, gate electrodes G1 and G4 may be electrically coupled to, or electrically decoupled from, gate electrodes G2 and G3. Regardless of whether gate electrodes G1 through G4 are physically and/or electrically connected, they are aligned to a square shaped (or rectangular shaped) ring R (as marked in FIGS. 4C and 4D), which is illustrated using dotted lines. Further, active regions OD1 through OD4 may be formed in insulation regions 12, which may be shallow trench isolation (STI) regions. The electrical connection of gate electrodes, sources, and drains of transistor units T1 through T4 may be achieved using contact plugs and metal lines, which are not shown in FIGS. 4A through 4D. FIG. 6, however, schematically illustrates the connections using dotted lines ML.

The sources of two or more transistor units in transistor units T1 through T4 may be interconnected. The drains of two or more transistor units may be interconnected. Accordingly, quadrangle transistor unit 10 may form a single transistor with all four transistor units T1 through T4 connected in parallel, as shown in FIGS. 4A and 4B. Alternatively, as shown in FIG. 4C, transistor units T1 and T4 may be connected in parallel, and transistor units T2 and T3 may be connected in parallel. However, transistor units T1 and T4 may be disconnected from transistors T2 and T3. Similarly, in FIG. 4D, all four transistor units T1 through T4 may be electrically connected in parallel, or parallel connected in pairs.

In the embodiments shown in FIGS. 4A through 4C, the portions of active regions inside the squares formed of gate electrodes G1 through G4 may form a common source or a common drain. Further, width W of gate electrodes may be smaller than the distance between gate electrodes G1 and G2 (or between G3 and G4). Accordingly, the common source or common drain may have a shape of a cross in a top view, with insulation regions 12 filling rest of the areas that are in the squares and are not occupied by the common source/drain. Width W of the common source/drain may be equal to, but not greater than, the distances between gate electrodes G1 and G2 (or G3 and G4). In other words, the common source/drains may not extend to directly underlying the respective gate electrodes G1 through G4, and may not extend to the corners of the square formed of gate electrodes G1 through G4.

Figure 4D:
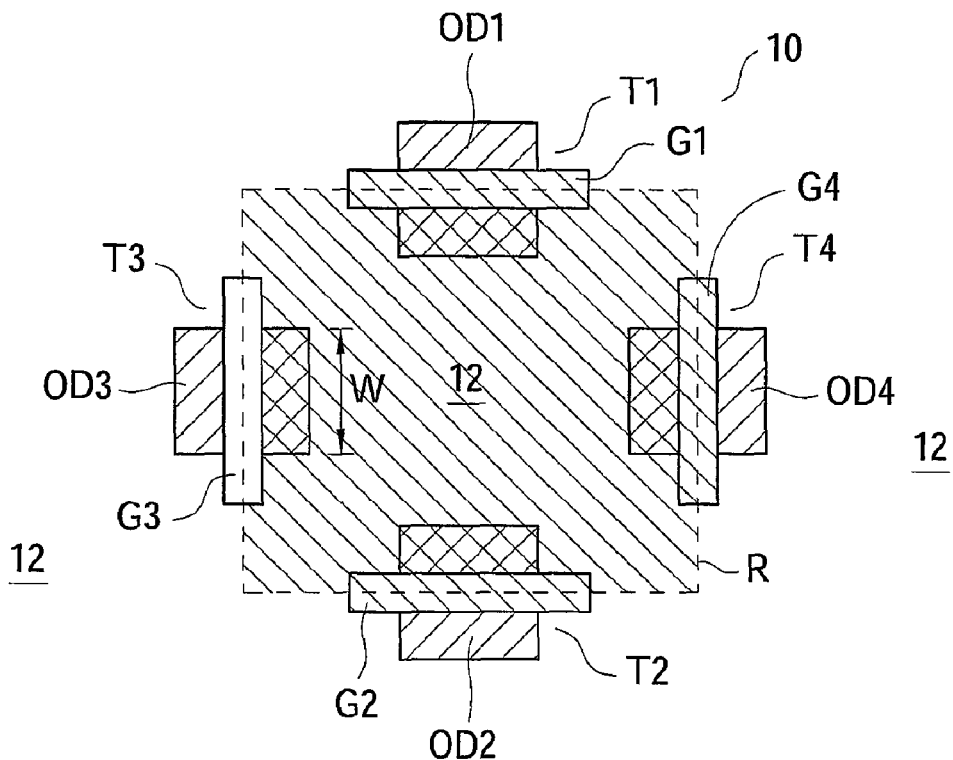
Figure 5A:
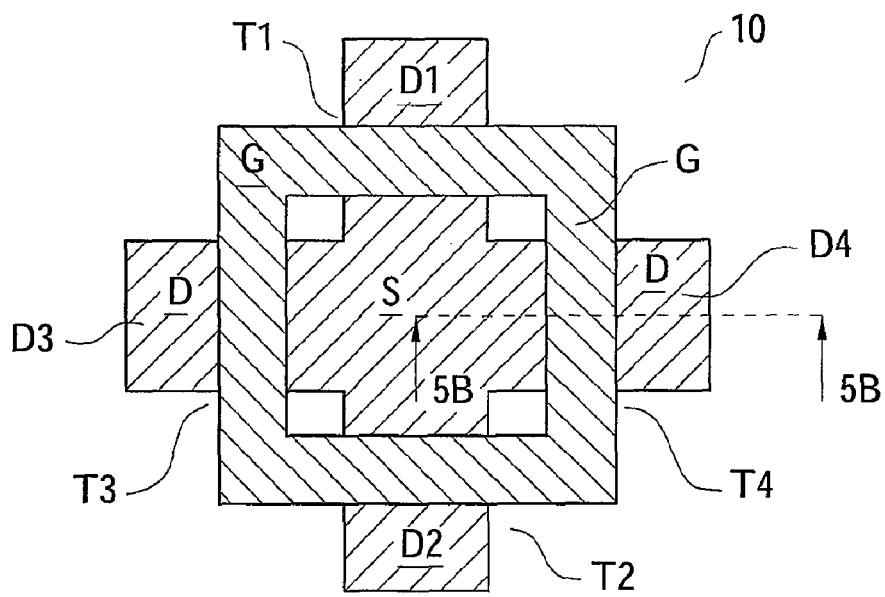
FIGS. 5A and 5B illustrate a layout and a cross-sectional view, respectively, of a quadrangle high-voltage transistor unit.
Figure 5B:
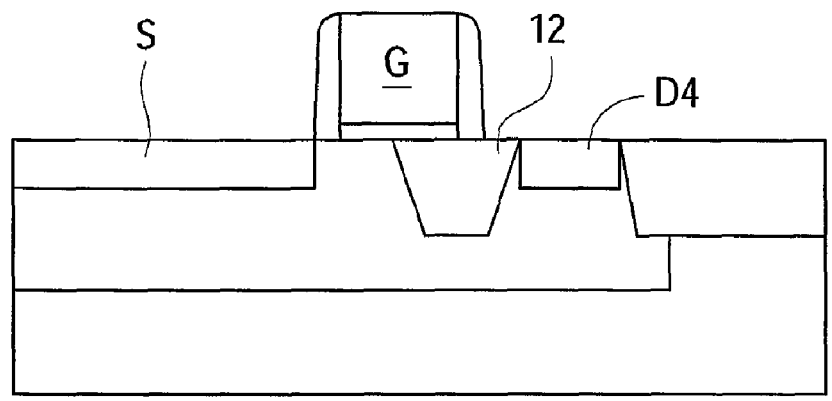

The embodiments may be low-voltage transistors or high-voltage transistors. For example, referring to FIGS. 5A and 5B, high-voltage quadrangle transistor unit 10 includes four gate electrodes forming a square, wherein each of the four transistor units T1 through T4 is a high-voltage transistor. A common source S is formed in the square, while drains D1 through D4 are formed outside of the square. FIG. 5B illustrates a cross-sectional view obtained from the plan crossing line 5B-5B in FIG. 5A. It is observed that due to the formation of insulation region 12, the drain-to-gate voltage is increased. FIG. 5B only illustrates an exemplary implementation of the high-voltage transistors, and other applicable implementations such as double diffused drain (DDD) are also in the scope of the present disclosure. Further, high-voltage quadrangle transistor unit 10 may also be implemented using essentially the same schemes as shown in any of FIGS. 4B through 4D.

Quadrangle transistor units may form a quadrangle transistor array, as shown in FIG. 6. In this embodiment, all transistor units throughout the array may be connected/coupled in parallel to form a single transistor have a high drive current, or may be disconnected from each other. The interconnection may be achieved through metal lines ML in metallization layers (not shown). Depending on the required drive current, the array may be expanded to add more columns and/or rows of quadrangle transistor units. Similarly, the embodiments shown in FIGS. 4B through 4D may also be used to form quadrangle transistor unit arrays.

Figure 7A:
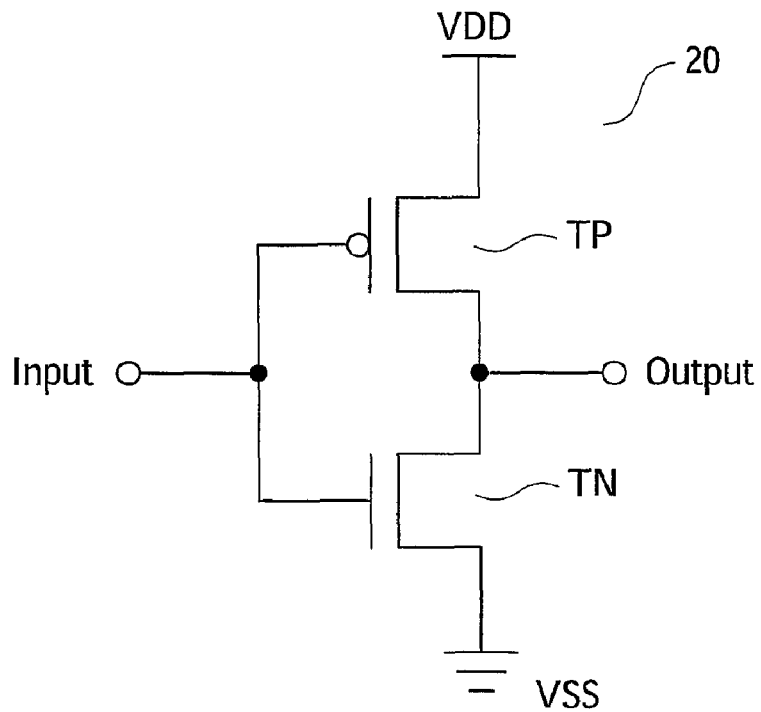
FIGS. 7A and 7B illustrate a circuit diagram and a layout of a quadrangle inverter, respectively.
Figure 7B:
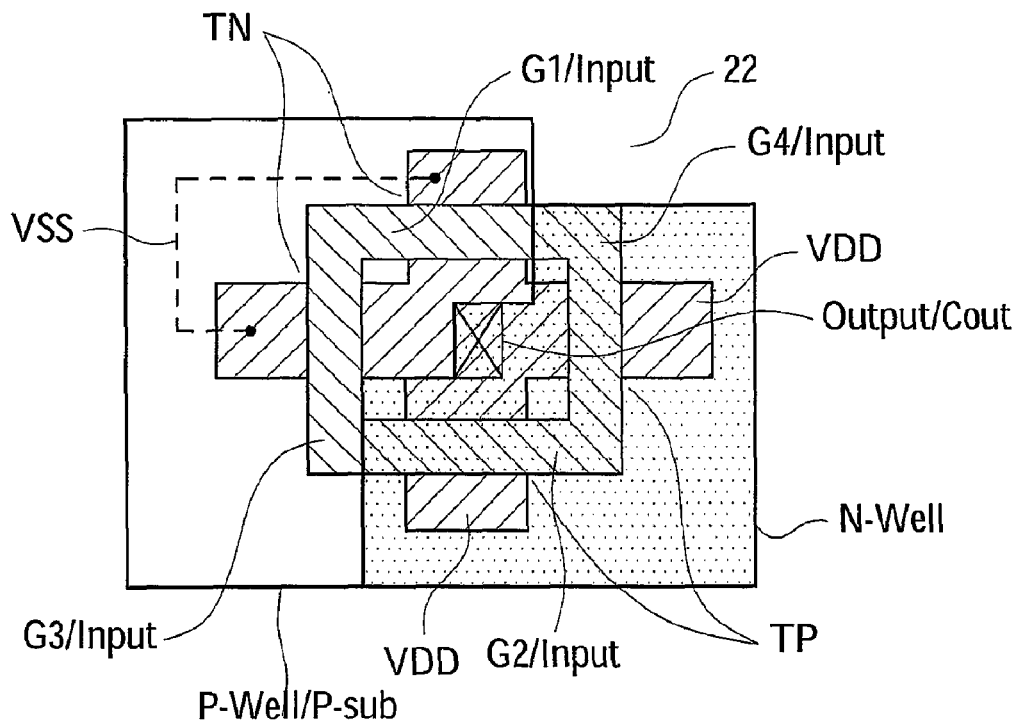

FIGS. 7A and 7B illustrate a circuit diagram and a layout, respectively, of inverter 20. Inverter 20 includes NMOS transistor TN and PMOS transistor TP. Referring to FIG. 7B, quadrangle transistor unit 22 implements inverter 20, with gate electrodes G1 and G3 being used to form NMOS transistor TN, and gate electrodes G2 and G4 being used to form PMOS transistor TP. Further, gate electrodes G1 through G4 form a close-loop ring, although NMOS transistor TN and PMOS transistor TP may also be implemented using the schemes shown in FIGS. 4B through 4D. The input of inverter 20 is connected to gate electrodes G1 through G4, and the output is connected to the common drain formed inside the gate electrode ring. PMOS transistor TP may be formed in an N-well, while NMOS transistor TN may be formed in a P-well or a P-substrate. The active regions of PMOS transistor TP and NMOS transistor TN in the ring are adjacent to, and may contact, each other, and contact plug Cout may be landed on the active regions of both PMOS transistor TP and NMOS transistor TN, which active regions are in the gate electrode ring. Contact plug Cout is the output of inverter 20. Again, in FIG. 7B, although gate electrodes G1 through G4 are shown as forming adopting the scheme as shown in FIG. 4A, the schemes as shown in FIGS. 4B through 4D may also be adopted.

Figure 8A:
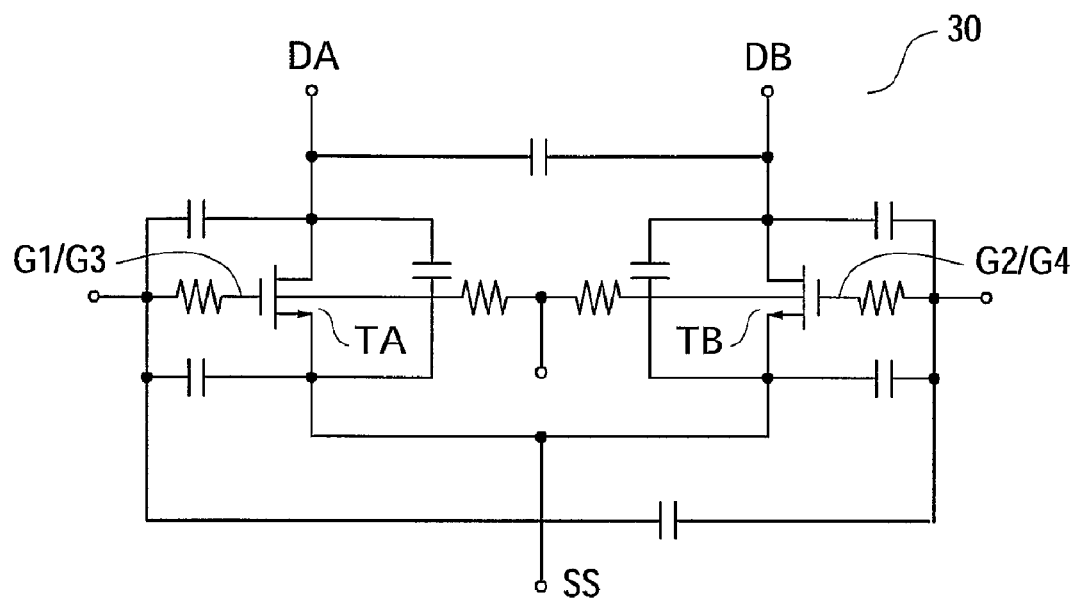
FIGS. 8A through 8C illustrate a differential transistor pair implemented using a quadrangle transistor unit(s) in accordance with various embodiments.
Figure 8B:
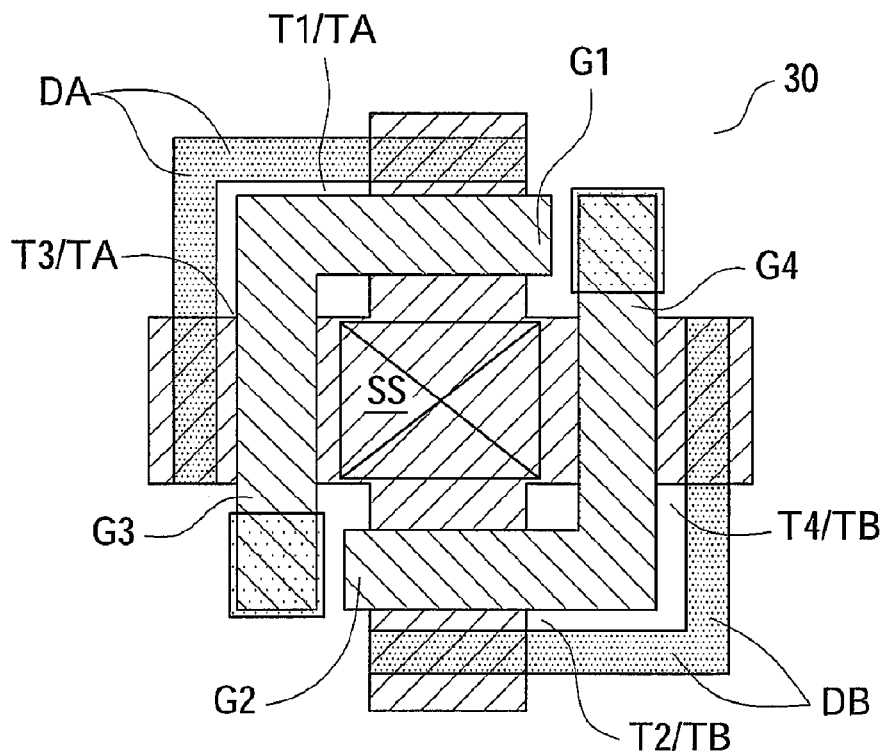
Figure 8C:
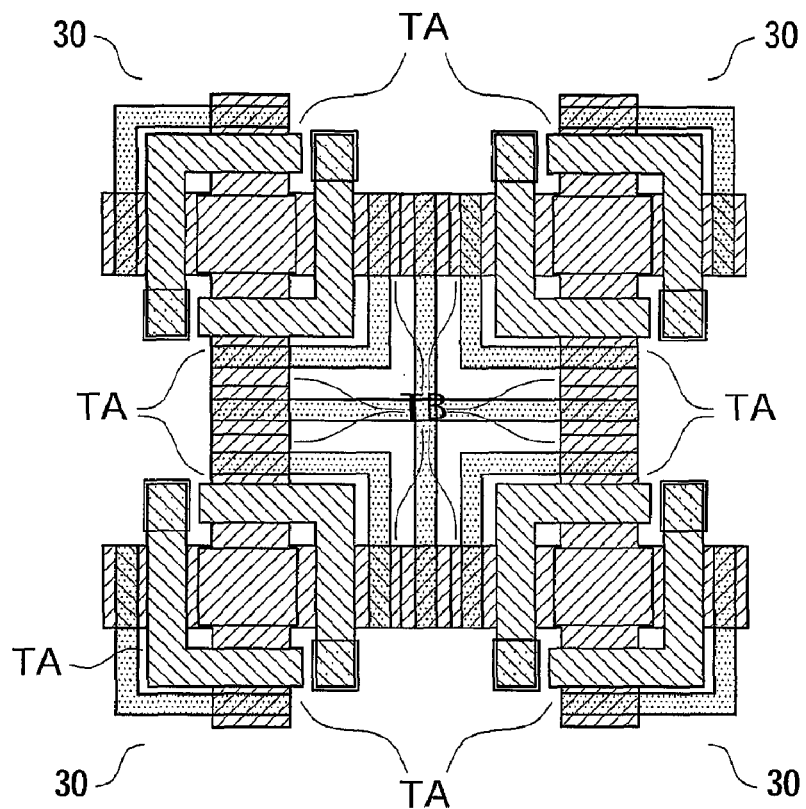

FIGS. 8B and 8C illustrate the layouts of differential transistor pair TA and TB. The circuit diagram is shown in FIG. 8A. Drains DA and DB of Differential transistor pair TA and TB are interconnected. As shown in FIG. 8B, quadrangle transistor unit 30 implements differential transistor pair TA and TB. Transistor TA is formed of transistor units T1 and T3, while transistor TB is formed of transistor units T2 and T4. The common source SS is placed in the square formed of gate electrodes, while drains DA and DB are formed outside of the square. FIG. 8C illustrates an array formed of four quadrangle transistor units 30, which are connected in parallel, meaning transistors TA of quadrangle transistor units 30 are connected in parallel, and transistors TB of quadrangle transistor units 30 are connected in parallel.

Figure 9A:
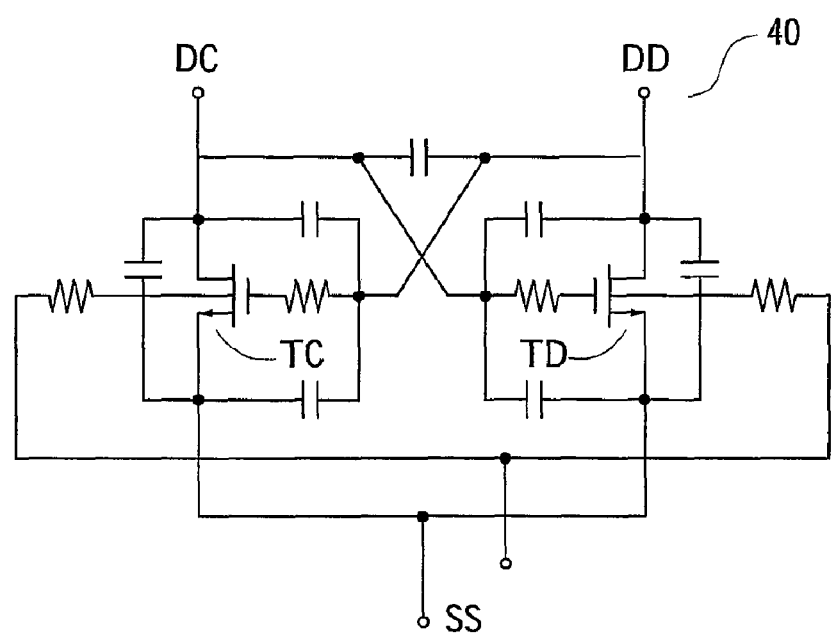
FIGS. 9A through 9C illustrate a cross-coupled transistor pair implemented using a quadrangle transistor unit(s) in accordance with various embodiments.
Figure 9B:
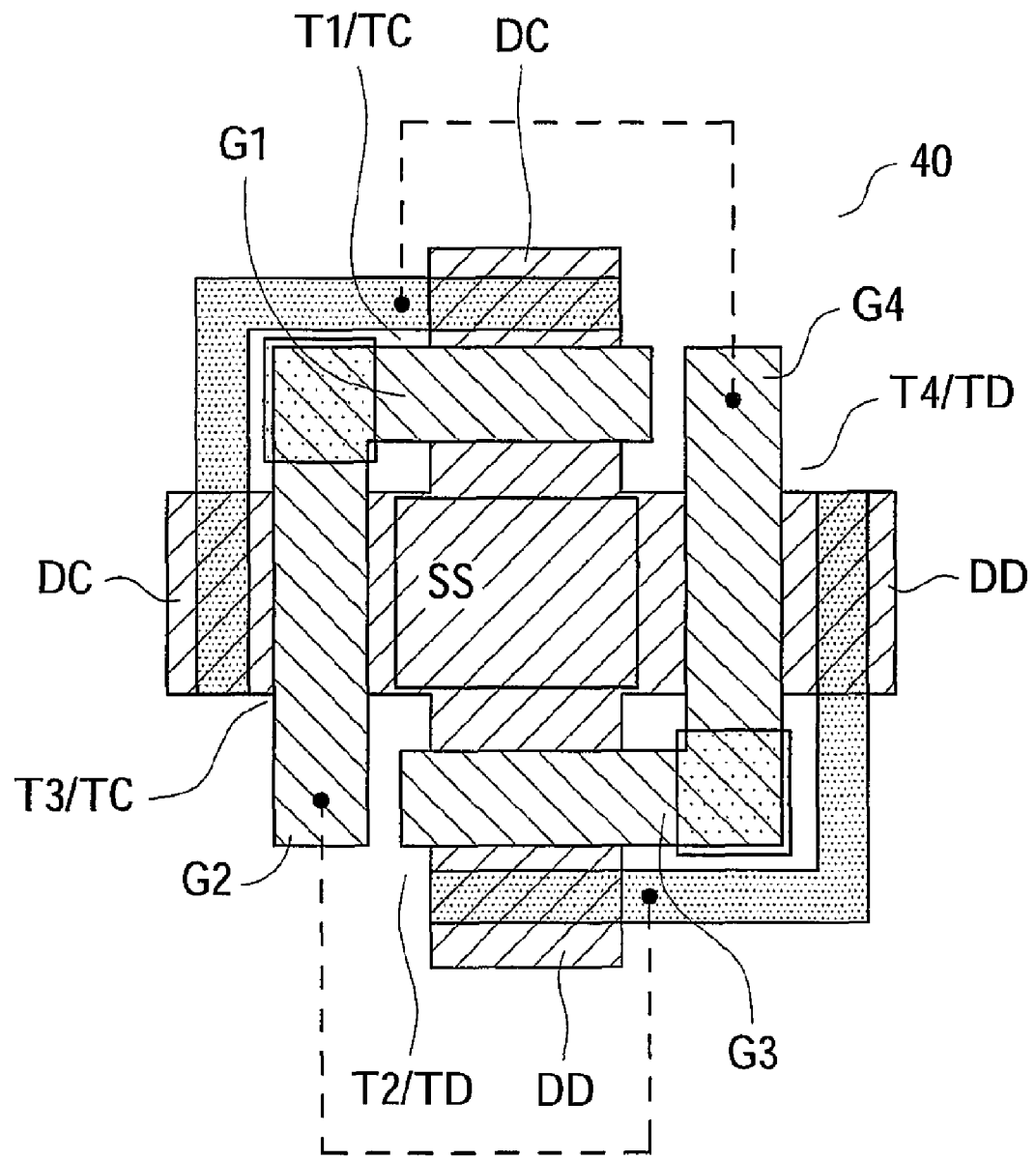
Figure 9C:
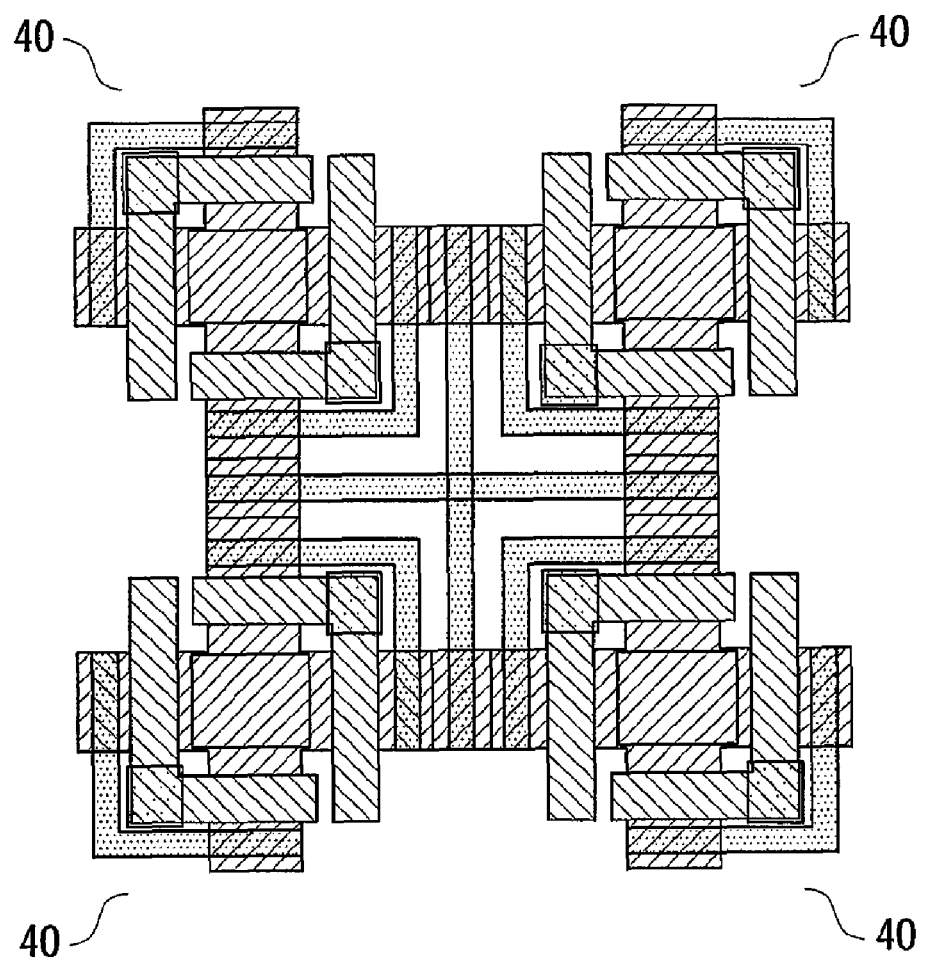

FIGS. 9B and 9C illustrate layouts of a cross-coupled transistor pair TC and TD. The respective circuit diagram is shown in FIG. 9A. FIG. 9B illustrates quadrangle transistor unit 40 that implements cross-coupled pair TC and TD. Transistor TC is formed of transistor units T1 and T3, while transistor TD is formed of transistor units T2 and T4. The common source SS is again placed in the square formed of gate electrodes, while drains DC and DD are formed outside of the square. The cross-connection of gates and drains are illustrated using dotted lines. FIG. 9C illustrates an array formed of four quadrangle transistor units 40, which are connected in parallel to form a single cross-coupled transistor pair.

Figure 10A:
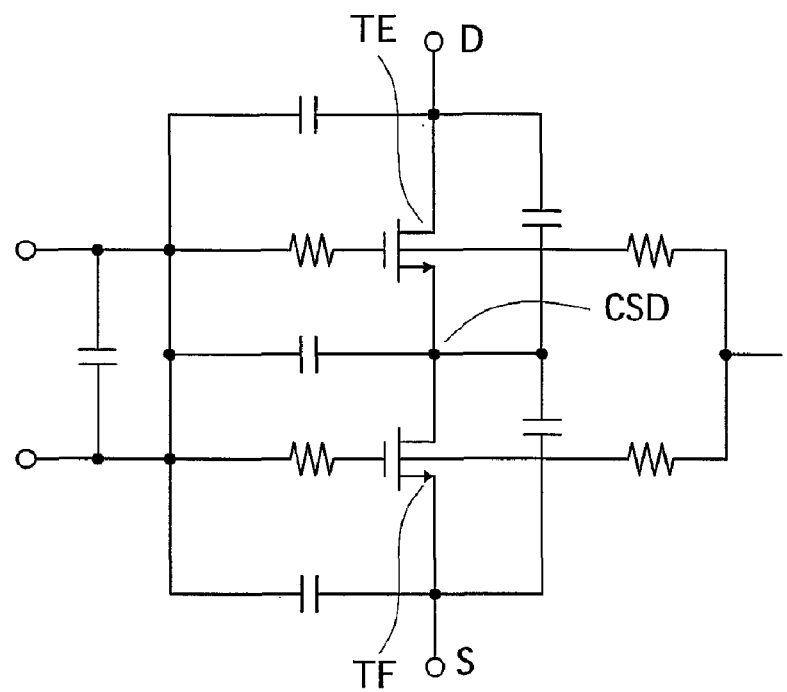
FIGS. 10A through 10C illustrate cascaded transistor pair implemented using a quadrangle transistor unit(s) in accordance with various embodiments.
Figure 10B:
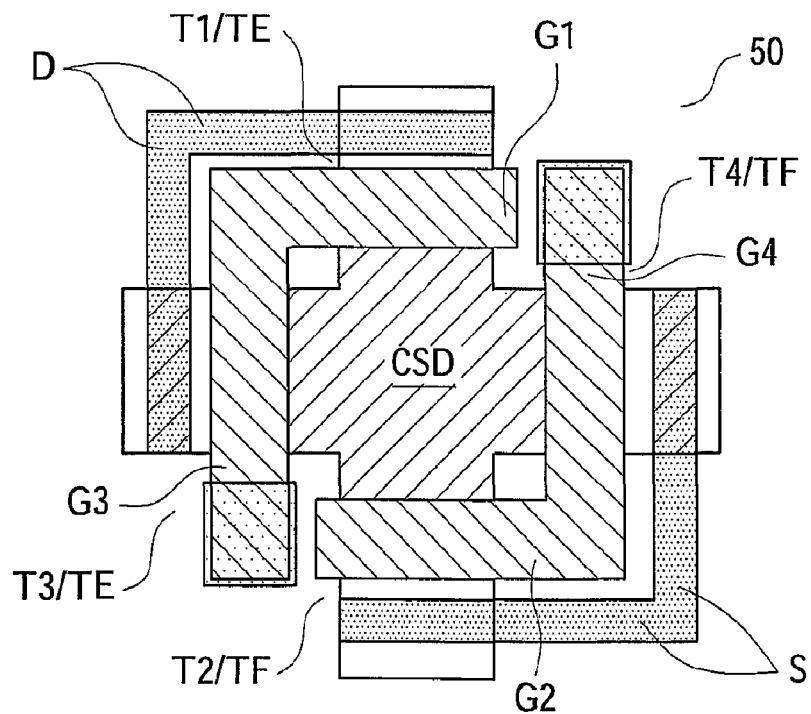
Figure 10C:
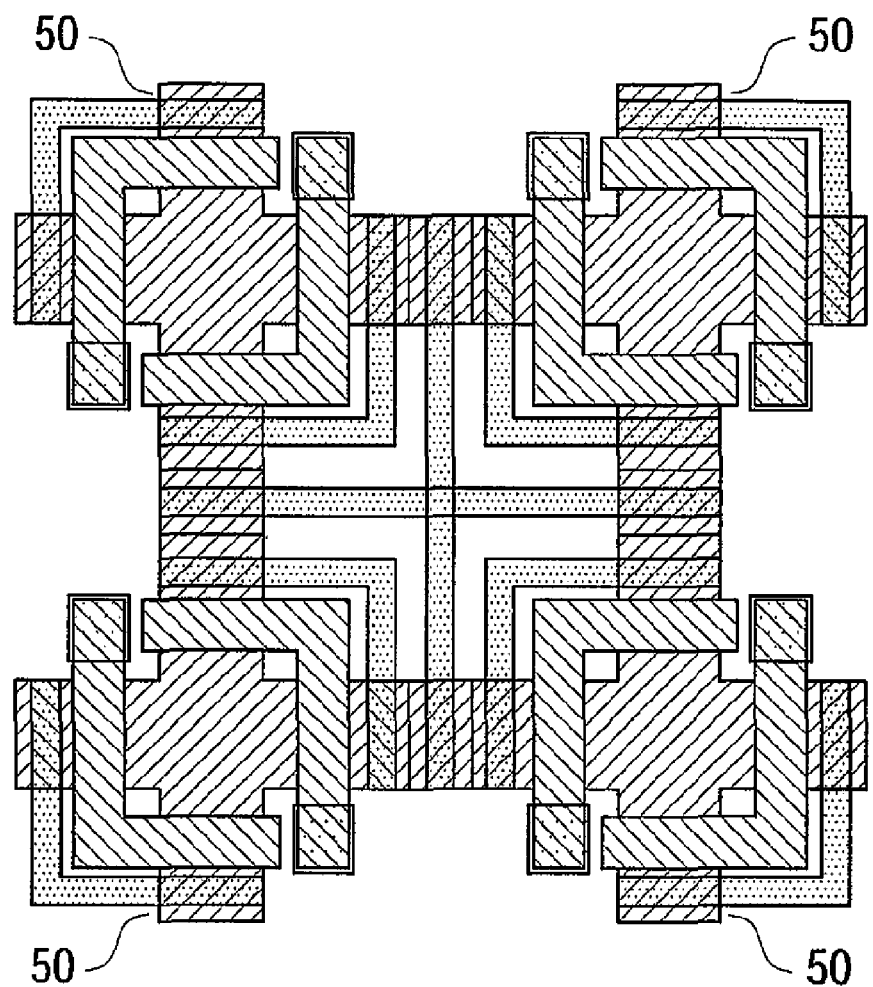

FIGS. 10B and 10C illustrate layouts of a cascaded transistor pair TE and TF, with the source of transistor TE connected to the drain of transistor TF. The respective circuit diagram is shown in FIG. 10A. As shown in FIG. 10B, quadrangle transistor unit 50 implements cascaded transistor pair TE and TF. Transistor TE is formed of transistor units T1 and T3, while transistor TF is formed of transistor units T2 and T4. Active region CSD in the square represents the source of transistors TE and the drain of transistor TF, while drain D of transistors TE and source S of transistor TF are formed outside of the square. FIG. 10C illustrates an array formed of four quadrangle transistor units 50, which are connected in parallel to form a single cascaded transistor pair.

In the embodiments, although gate electrodes of quadrangle transistor units are referred to as forming squares or aligned to sides of the squares, the gate electrodes of the quadrangle transistor units may also form rectangles with lengths not equal to widths, or aligned to the sides of the rectangles.

In the embodiments, instead of aligning gate electrodes parallel to each other, gate electrodes in quadrangle transistor units form a square. Accordingly, all four gate electrodes may have a same symmetric environment, all four sources may have a same symmetric environment, and all four drains may have a same symmetric environment. This results in the reduction in the adverse effects related to length of diffusion (LOD), mask misalignment, optical proximity, and the like. Further, the modeling becomes simpler and more accurate with the implementation of quadrangle transistor units.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a quadrangle transistor unit comprising four transistor units, wherein each of the four transistor units comprises a gate electrode, wherein the gate electrodes of the four transistor units are aligned to four sides of a square, wherein source/drain regions of the four transistor units in the region surrounded by the gate electrodes of the four transistor units are physically connected to form a common source/drain having a cross shape in a top view of the device, and wherein at least two of the four transistor units are connected in parallel.

2. The device of claim 1, wherein the four transistor units are connected in parallel to form a single transistor.

3. The device of claim 1, wherein the gate electrodes of the four transistor units are physically connected to form a continuous gate electrode.

4. The device of claim 3, wherein the continuous gate electrode forms a close-loop ring.

5. The device of claim 1, wherein the region surrounded by the gate electrodes of the four transistor units is free from any additional transistor formed therein.

6. The device of claim 1, wherein the quadrangle transistor unit is in an array comprising a plurality of identical quadrangle transistor units.

7. The device of claim 1, wherein each of the four transistor units is a high-voltage device.

8. The device of claim 1, wherein the gate electrodes on two neighboring sides of the square are physically connected to form a gate electrode of an NMOS transistor of an inverter, and wherein the gate electrodes on two remaining neighboring sides of the square are physically connected to form a gate electrode of a PMOS transistor of the inverter.

9. The device of claim 1, wherein the gate electrodes on two neighboring sides of the square are physically connected to form a gate electrode of a first transistor in a differential transistor pair, and wherein the gate electrodes on two remaining neighboring sides of the square are physically connected to form a gate electrode of a second transistor in the differential transistor pair.

10. The device of claim 1, wherein the gate electrodes on two neighboring sides of the square are physically connected to form a gate electrode of a first transistor in a cross-coupled transistor pair, and wherein the gate electrodes on two remaining neighboring sides of the square are physically connected to form a gate electrode of a second transistor in the cross-coupled transistor pair.

11. The device of claim 1, wherein the gate electrodes on two neighboring sides of the square are physically connected to form a gate electrode of a first transistor in a cascaded transistor pair, and wherein the gate electrodes on two remaining neighboring sides of the square are physically connected to form a gate electrode of a second transistor in the cascaded transistor pair.

12. A device comprising:
a quadrangle transistor unit comprising:
a gate electrode forming a square comprising four sides;
four active regions, wherein each of the four active regions comprises:
an outside portion outside the square and forming a first source/drain region; and
an internal portion inside the square and forming a second source/drain region, wherein the first and the second source/drain regions and a respective side of the gate electrode between the first and the second source/drain regions form a respective quadrant of the quadrangle transistor unit;
four shallow trench isolation (STI) regions in the square, with each of the four STI regions adjacent to a corner of the square; and
a first plurality of electrical connections electrically coupling the first source/drain regions of the respective quadrants of the quadrangle transistor unit.

13. The device of claim 12 further comprising a second plurality of electrical connections electrically coupling the second source/drain regions of the quadrangle transistor unit.

14. The device of claim 12, wherein the internal portions of the four active regions are physically connected to form a common source/drain region having a cross shape.

15. The device of claim 12, wherein the four active regions do not extend directly under four corners of the square.

* * * * *